(12) United States Patent
Kawarazaki

(10) Patent No.: US 9,837,266 B2
(45) Date of Patent: *Dec. 5, 2017

(54) METHOD AND APPARATUS FOR HEAT-TREATING HIGH DIELECTRIC CONSTANT FILM

(71) Applicant: SCREEN Holdings Co., Ltd., Kyoto (JP)

(72) Inventor: Hikaru Kawarazaki, Kyoto (JP)

(73) Assignee: SCREEN Holdings Co., Ltd., Kyoto (JP)

(*) Notice: Subject to any disclaimer, the term of this patent is extended or adjusted under 35 U.S.C. 154(b) by 0 days.

This patent is subject to a terminal disclaimer.

(21) Appl. No.: 15/380,000

(22) Filed: Dec. 15, 2016

(65) Prior Publication Data

US 2017/0098543 A1  Apr. 6, 2017

Related U.S. Application Data

(63) Continuation of application No. 14/975,992, filed on Dec. 21, 2015, now Pat. No. 9,557,110.

(30) Foreign Application Priority Data

Jan. 7, 2015  (JP) ................................ 2015-001302

(51) Int. Cl.
    *H01L 21/02* (2006.01)
(52) U.S. Cl.
    CPC .. *H01L 21/02345* (2013.01); *H01L 21/02329* (2013.01)

(58) Field of Classification Search
    CPC ................................................. H01L 21/02255
    See application file for complete search history.

(56) References Cited

U.S. PATENT DOCUMENTS

| | | | |
|---|---|---|---|
| 8,548,311 B2 | 10/2013 | Koelmel et al. | ............. 392/408 |
| 9,552,989 B2 | 1/2017 | Koelmel et al. | .... H01L 21/2636 |
| 9,557,110 B2* | 1/2017 | Kawarazaki | ........ F27B 17/0025 |
| 2004/0266214 A1 | 12/2004 | Suguro | |

(Continued)

FOREIGN PATENT DOCUMENTS

| | | |
|---|---|---|
| JP | 2013-073946 | 4/2013 |
| TW | 201314771 A1 | 4/2013 |
| TW | 201442119 | 11/2014 |

OTHER PUBLICATIONS

Sep. 5, 2016 Taiwanese Office Action with Japanese translation and English partial translation based on the Japanese translation.

(Continued)

*Primary Examiner* — Kyoung Lee
(74) *Attorney, Agent, or Firm* — Ostrolenk Faber LLP

(57) ABSTRACT

A substrate in which a high-dielectric-constant gate insulator is formed on a silicon substrate with an interface layer film sandwiched in between is housed in a chamber. The method of the invention including: (a) housing the substrate in a chamber; (b) supplying ammonia to the chamber to foam an ammonia atmosphere; and (c) applying flash light to a surface of the substrate housed in the chamber to heat the high dielectric constant film, wherein the flash light applied in said step (c) has a spectral distribution that has a peak in a wavelength range of 200 to 300 nm.

4 Claims, 15 Drawing Sheets

(56) References Cited

U.S. PATENT DOCUMENTS

| | | | |
|---|---|---|---|
| 2010/0074604 A1 | 3/2010 | Koelmel et al. | ............. 392/408 |
| 2011/0081753 A1 | 4/2011 | Yamanari et al. | |
| 2013/0078786 A1 | 3/2013 | Fuse et al. | |
| 2013/0337661 A1* | 12/2013 | Kato | ....................... H01L 21/26 438/795 |
| 2014/0004716 A1 | 1/2014 | Koelmel et al. | .... H01L 21/2636 |

OTHER PUBLICATIONS

Paul Chambers et al., "Applications and Optoelectronic Methods of Detection of Ammonia," Optoelectronics—Devices and Applications, pp. 189-204, Oct. 2011.

Apr. 6, 2017 Taiwan Office Action for Taiwan App. No. 105100416 with English partial translation based on Japanese translation of same.

* cited by examiner

F I G . 4
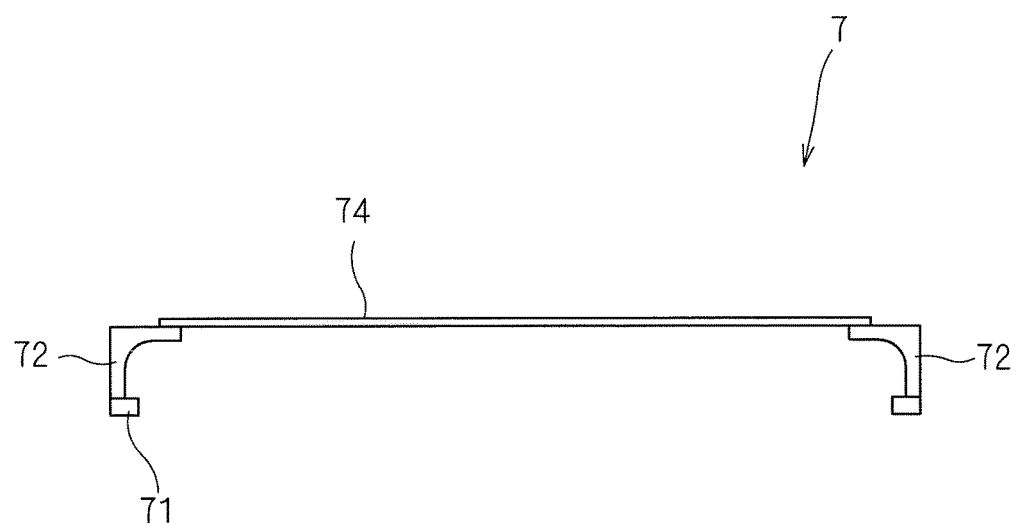

F I G. 7
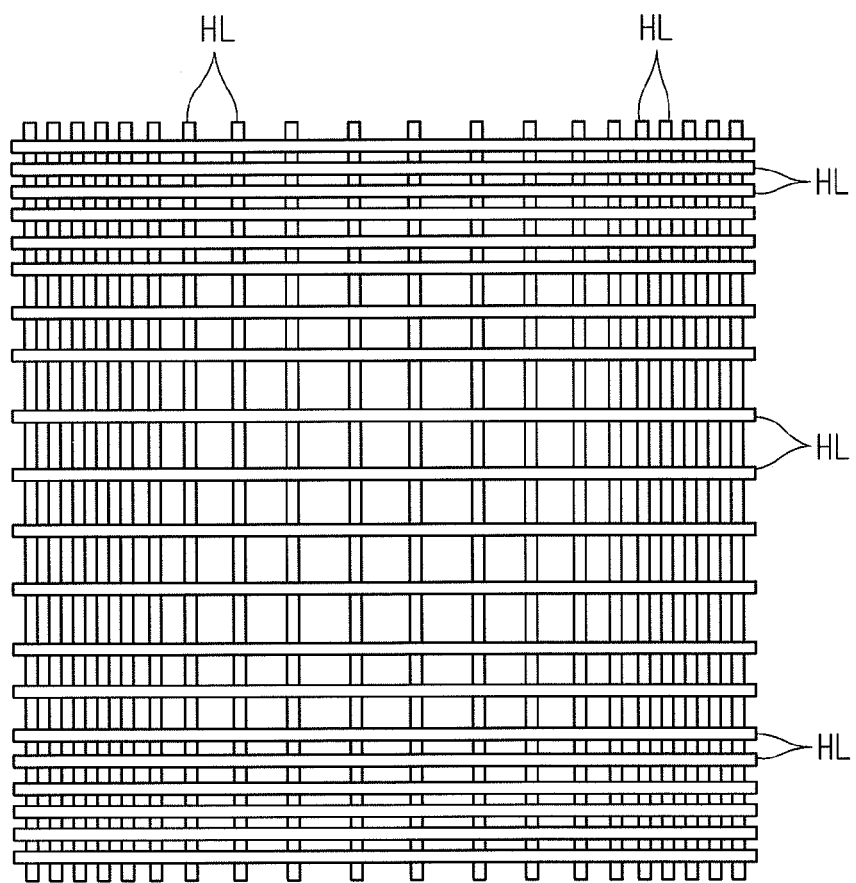

F I G . 1 0
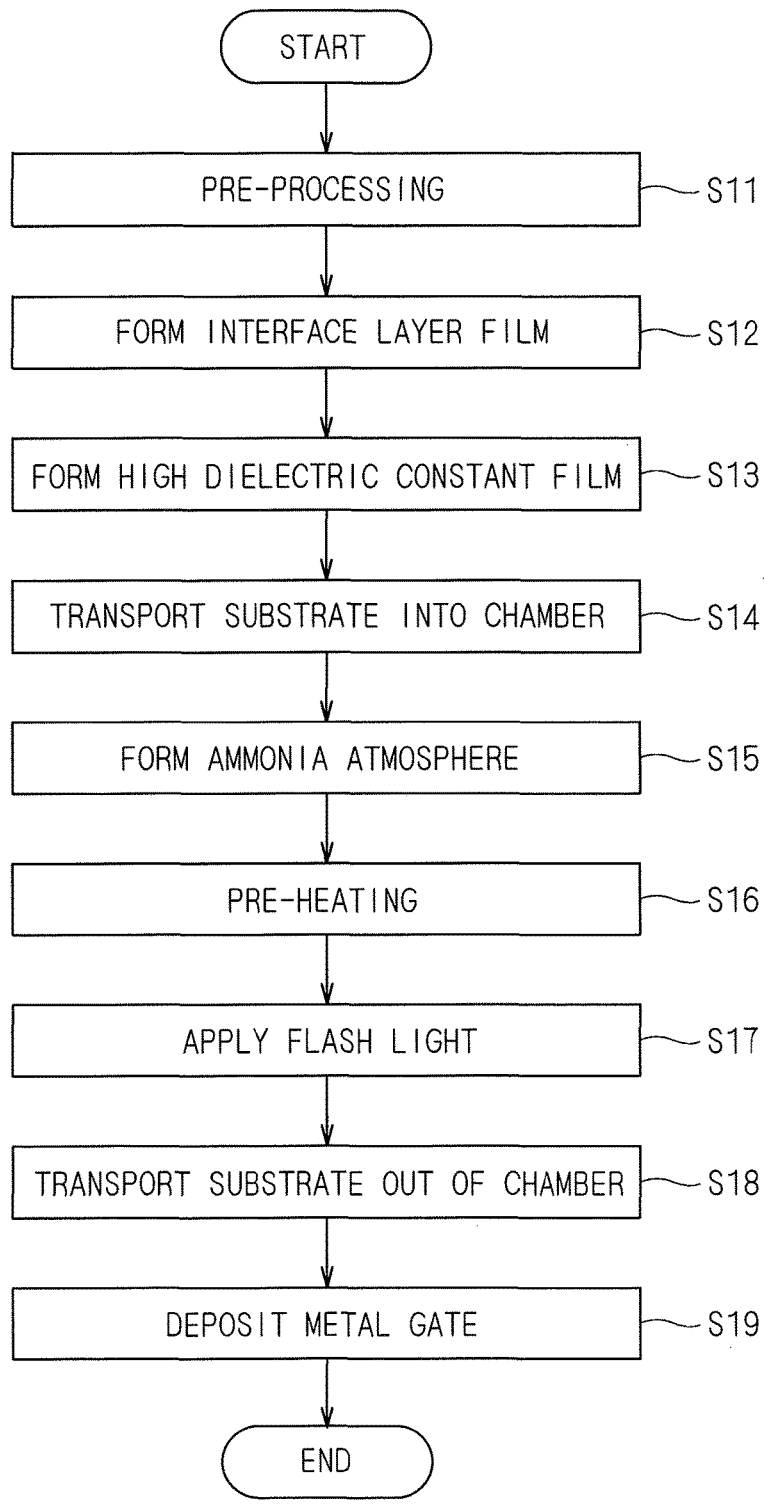

METHOD AND APPARATUS FOR HEAT-TREATING HIGH DIELECTRIC CONSTANT FILM

CROSS REFERENCE TO RELATED APPLICATIONS

This is a continuation of U.S. patent application Ser. No. 14/975,992, filed Dec. 21, 2015 in the name of Hikaru KAWARAZAKI and entitled METHOD AND APPARATUS FOR HEAT-TREATING HIGH DIELECTRIC CONSTANT FILM, which claims priority from Japanese Application No. 2015-001302, filed Jan. 7, 2015.

BACKGROUND OF THE INVENTION

Field of the Invention

The present invention relates to a heat treatment method and a heat treatment apparatus for applying flash light to a thin plate-like precision electronic substrate (hereinafter, simply referred to as a "substrate") such as a semiconductor wafer or a glass substrate, in which a high-dielectric-constant gate insulator is formed on a base material such as silicon with an interface layer film sandwiched in between, to heat the high-dielectric-constant gate insulator.

Description of the Background Art

Conventional field-effect transistors (FETs) have commonly used silicon dioxide ($SiO_2$) for their gate insulators, but as the gate insulators become thinner along with downsizing of devices, increasing leakage current is becoming an issue. Thus, use of materials (high dielectric constant materials) having higher dielectric constants than silicon dioxide for gate insulators and development of metal gate electrodes, i.e., use of metals for gate electrodes, are proceeding as disclosed in, for example, US2011/0081753.

However, high-dielectric-constant gate insulators formed by depositing high dielectric constant materials contain a large number of defects such as point defects, and such defects can be a cause of leakage current. Examples of methods for reducing defects in the high-dielectric-constant gate insulators include a method for destroying defects through post-deposition annealing (PDA) and a method for inactivating defects by introduction of nitrogen (nitriding).

Nitriding of a high-dielectric-constant gate insulator is generally required to be conducted at high temperatures. However, a lengthy high-temperature processing time can cause nitriding of even the interface layer film such as silicon dioxide, which is formed as the base of the high-dielectric-constant gate insulator, resulting in degradation in the quality of the interface. Following this, problems arise such as a considerable decrease in the mobility of carriers and an increase in equivalent oxide thickness (EOT).

SUMMARY OF THE INVENTION

The present invention is intended for a heat treatment method for heating a substrate in which a high dielectric constant film is deposited on a base material with an interface layer film sandwiched in between.

In one aspect of the present invention, the heat treatment method includes the steps of (a) housing the substrate in a chamber, (b) supplying ammonia to the chamber to form an ammonia atmosphere, and (c) applying flash light to a surface of the substrate housed in the chamber to heat the high dielectric constant film.

Heating the high dielectric constant film by the application of flash light to the substrate in an ammonia atmosphere accelerates nitriding of the high dielectric constant film and reduces defects. In addition, an extremely short-time application of flash light suppresses nitriding of the interface layer film, which is formed as the base of the high dielectric constant film.

Preferably, the flash light applied in the step (c) has a spectral distribution that has a peak in a wavelength range of 200 to 300 nm.

Preferably, the flash light applied in the step (c) has a spectral distribution showing that relative intensity at a wavelength of 300 nm is 20% or more higher than an intensity at a wavelength of 500 nm.

The application of flash light having a relatively large number of wavelength components with wavelengths in the ultraviolet region allows the high dielectric constant film and ammonia molecules to efficiently absorb the flash light and be activated, consequently reliably accelerating nitriding of the high dielectric constant film.

The present invention is also intended for a heat treatment apparatus for heating a substrate in which a high dielectric constant film is deposited on a base material with an interface layer film sandwiched in between.

In one aspect of the present invention, the heat treatment apparatus includes a chamber in which the substrate is housed, an atmosphere forming part that supplies ammonia to the chamber to form an ammonia atmosphere, and a flash lamp that applies flash light to a surface of the substrate housed in the chamber.

Heating the high dielectric constant film by the application of flash light to the substrate in an ammonia atmosphere accelerates nitriding of the high dielectric constant film and reduces defects. In addition, an extremely short-time application of flash light suppresses nitriding of the interface layer film, which is formed as the base of the high dielectric constant film.

Preferably, the flash lamp emits flash light with a spectral distribution that has a peak in a wavelength range of 200 to 300 nm.

Preferably, the flash lamp emits flash light with a spectral distribution showing that relative intensity at a wavelength of 300 nm is 20% or more higher than an intensity at a wavelength of 500 nm.

The application of flash light having a relatively large number of wavelength components with wavelengths in the ultraviolet region allows the high dielectric constant film and ammonia molecules to efficiently absorb the flash light and be activated, consequently reliably accelerating nitriding of the high dielectric constant film.

Thus, an object of the present invention is to accelerate nitriding of the high dielectric constant film while suppressing nitriding of the interface layer film.

These and other objects, features, aspects and advantages of the present invention will become more apparent from the following detailed description of the present invention when taken in conjunction with the accompanying drawings.

BRIEF DESCRIPTION OF THE DRAWINGS

FIG. 4 is a side view of the holder as viewed from one side;

FIG. 7 is a plan view illustrating the arrangement of a plurality of halogen lamps;

FIG. 10 is a flowchart illustrating a procedure of processing for forming a gate on a substrate;

FIG. 11 illustrates a stacked structure in which a high-dielectric-constant gate insulator is formed on a base material of a substrate with an interface layer film sandwiched in between;

DESCRIPTION OF THE PREFERRED EMBODIMENTS

Hereinafter, a preferred embodiment of the present invention will be described in detail with reference to the drawings.

Figure 1:
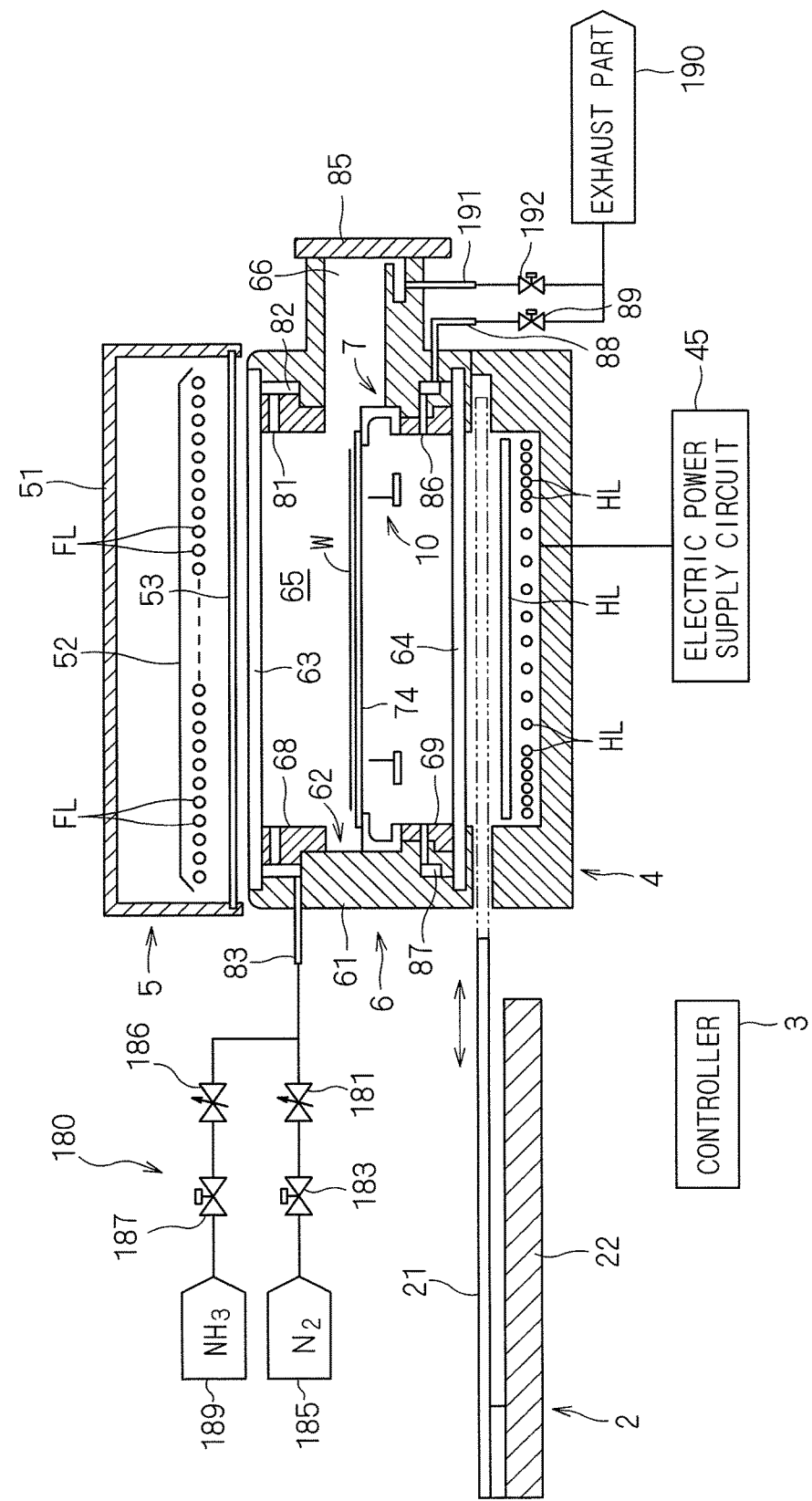
FIG. 1 is a longitudinal cross-sectional view illustrating a configuration of a heat treatment apparatus according to the present invention.

FIG. 1 is a longitudinal cross-sectional view illustrating a configuration of a heat treatment apparatus 1 according to the present invention. The heat treatment apparatus 1 according to a preferred embodiment of the present invention is a flash-lamp annealing (FLA) apparatus for applying flash light in an ammonia atmosphere to a semiconductor substrate W in which a high-dielectric-constant gate insulator (high-k gate insulator) is formed with an interface layer film sandwiched in between, and thereby accelerating nitriding of the high-dielectric-constant gate insulator. To facilitate understanding, the dimensions and number of each part are exaggerated or simplified as necessary in FIG. 1 and subsequent drawings.

The heat treatment apparatus 1 includes a chamber 6 in which the substrate W is housed, a flash heater 5 with a plurality of built-in flash lamps FL, a halogen heater 4 with a plurality of built-in halogen lamps HL, and a shutter mechanism 2. The flash heater 5 is provided above the chamber 6, and the halogen heater 4 is provided below the chamber 6. The heat treatment apparatus 1 also includes, within the chamber 6, a holder 7 that holds the substrate W in a horizontal position, and a transfer mechanism 10 for transferring the substrate W between the holder 7 and a device outside the apparatus. The heat treatment apparatus 1 further includes an ammonia supply mechanism 180 for supplying ammonia ($NH_3$) to the interior of the chamber 6. The heat treatment apparatus 1 further includes a controller 3 that controls operating mechanisms provided in the shutter mechanism 2, the ammonia supply mechanism 180, the halogen heater 4, the flash heater 5, and the chamber 6 to perform heat treatments of the substrate W.

The chamber 6 is configured by mounting quartz chamber windows on the top and bottom of a tubular chamber side portion 61. The chamber side portion 61 has a generally tubular shape that is open at the top and the bottom, the opening at the top being equipped with and closed by an upper chamber window 63 and the opening at the bottom being equipped with and closed by a lower chamber window 64. The upper chamber window 63, which forms the ceiling of the chamber 6, is a disc-shaped member made of quartz and functions as a quartz window that allows flash light emitted from the flash heater 5 to pass through into the chamber 6. The lower chamber window 64, which forms the floor of the chamber 6, is also a disc-shaped member made of quartz and functions as a quartz window that allows light emitted from the halogen heater 4 to pass through into the chamber 6. In particular, the upper chamber window 63 that allows flash light to pass through into the chamber 6 is made of synthetic quartz having high transmittance in even the ultraviolet region at wavelengths of 300 nm or less.

A reflection ring 68 is mounted on the upper part of the inner wall surface of the chamber side portion 61, and a reflection ring 69 is mounted on the lower part thereof. Both of the reflection rings 68 and 69 have an annular shape. The upper reflection ring 68 is mounted by being fitted from above the chamber side portion 61. The lower reflection ring 69 is mounted by being fitted from below the chamber side portion 61 and fastened with screws (not shown). In other words, the reflection rings 68 and 69 are both removably mounted on the chamber side portion 61. The chamber 6 has an inner space that is surrounded by the upper chamber window 63, the lower chamber window 64, the chamber side portion 61, and the reflection rings 68 and 69 and that is defined as a heat treatment space 65.

With the reflection rings 68 and 69 mounted on the chamber side portion 61, the chamber 6 has a recessed portion 62 in its inner wall surface. That is, the recessed portion 62 is formed by being surrounded by a central portion of the inner wall surface of the chamber side portion 61 on which the reflection rings 68 and 69 are not mounted, a lower end face of the reflection ring 68, and an upper end face of the reflection ring 69. The recessed portion 62 has an annular shape extending in the horizontal direction along the inner wall surface of the chamber 6, and surrounds the holder 7 that holds the substrate W.

The chamber side portion 61 and the reflection rings 68 and 69 are each made of a metal material (e.g., stainless steel) having excellent strength and heat resistance. The inner circumferential surfaces of the reflection rings 68 and 69 are mirror-finished by electrolytic nickel plating.

The chamber side portion 61 has a transport opening (throat) 66 through which the substrate W is transported into and out of the chamber 6. The transport opening 66 is openable and closable by a gate valve 85. The transport opening 66 is communicatively connected to the outer circumferential surface of the recessed portion 62. When the gate valve 85 opens and the transport opening 66 is opened, the substrate W can pass through the recessed portion 62 and be transported into and out of the heat treatment space 65 through the transport opening 66. When the gate valve 85 closes and the transport opening 66 is closed, the heat treatment space 65 in the chamber 6 becomes an enclosed space.

The chamber 6 also has a gas supply port 81 through which a predetermined gas is supplied to the heat treatment space 65, in the upper part of the inner wall. The gas supply port 81 is formed at a position above the recessed portion 62 and may be formed in the reflection ring 68. The gas supply port 81 is communicatively connected to a gas supply pipe 83 via a buffer space 82 that is formed in an annular shape inside the side wall of the chamber 6. The gas supply pipe 83 is connected to the ammonia supply mechanism 180. To be specific, the gas supply pipe 83 bifurcates into two paths, one of the paths being connected to a nitrogen gas supply source 185 and the other path being connected to an ammonia supply source 189. Out of the two paths of the bifurcated gas supply pipe 83, piping that is connected to the nitrogen gas supply source 185 has interposed therein a valve 183 and a flow control valve 181, and piping that is connected to the ammonia supply source 189 has interposed therein a valve 187 and a flow control valve 186.

When the valve 183 opens, a nitrogen gas ($N_2$) is fed from the nitrogen gas supply source 185 through the gas supply pipe 83 to the buffer space 82. The amount of nitrogen gas flowing through the gas supply pipe 83 is adjusted by the flow control valve 181. When the valve 187 opens, an ammonia gas ($NH_3$) is fed from the ammonia supply source 189 through the gas supply pipe 83 to the buffer space 82. The amount of ammonia flowing through the gas supply pipe 83 is adjusted by the flow control valve 186. The gases flowing into the buffer space 82 spread out in the buffer space 82, which has lower fluid resistance than that of the gas supply port 81, and is supplied through the gas supply port 81 into the heat treatment space 65.

The nitrogen gas supply source 185, the valve 183, the flow control valve 181, the ammonia supply source 189, the valve 187, the flow control valve 186, the gas supply pipe 83, the buffer space 82, and the gas supply port 81 constitute the ammonia supply mechanism 180. By opening both of the valves 183 and 187, a mixed gas of ammonia and nitrogen gases can be supplied to the chamber 6. The concentration of ammonia in the mixed gas supplied to the chamber 6 by the ammonia supply mechanism 180 is approximately 10 vol % or less, and in the present embodiment, 2.5 vol %.

The chamber 6 also has a gas exhaust port 86 through which the gas in the heat treatment space 65 is exhausted, in the lower part of the inner wall. The gas exhaust port 86 is formed at a position below the recessed portion 62 and may be formed in the reflection ring 69. The gas exhaust port 86 is communicatively connected to a gas exhaust pipe 88 via a buffer space 87 that is formed in an annular shape inside the side wall of the chamber 6. The gas exhaust pipe 88 is connected to an exhaust part 190. The gas exhaust pipe 88 has a valve 89 interposed on the way of its path. When the valve 89 opens, the gas in the heat treatment space 65 is discharged from the gas exhaust port 86 through the buffer space 87 into the gas exhaust pipe 88. A configuration is also possible in which a plurality of gas supply ports 81 and a plurality of gas exhaust ports 86 are provided along the circumference of the chamber 6 or in which the gas supply port 81 and the gas exhaust port 86 have slit shapes.

One end of the transport opening 66 is also connected to a gas exhaust pipe 191 through which the gas in the heat treatment space 65 is discharged. The gas exhaust pipe 191 is connected to the exhaust part 190 via a valve 192. When the valve 192 opens, the gas in the chamber 6 is discharged through the transport opening 66.

The exhaust part 190 may be a vacuum pump or exhaust utilities in a factory in which the heat treatment apparatus 1 is installed. When the exhaust part 190 is a vacuum pump and an atmosphere in the heat treatment space 65, which is an enclosed space, is discharged without supply of any gases from the ammonia supply mechanism 180, the pressure in the chamber 6 can be reduced to a pressure under vacuum atmosphere. Even if a vacuum pump is not used as the exhaust part 190, the pressure in the chamber 6 can be reduced to a pressure less than atmospheric pressure by exhausting gases without supply of any gases from the ammonia supply mechanism 180.

The ammonia supply mechanism 180 and the exhaust part 190 enable formation of an ammonia atmosphere in the heat treatment space 65 of the chamber 6. That is, an ammonia atmosphere with a predetermined ammonia concentration (in the present embodiment, approximately 2.5 vol %) can be formed in the heat treatment space 65 by supplying a mixed gas of ammonia and a nitrogen gas serving as a dilute gas from the ammonia supply mechanism 180 to the heat treatment space 65 while the exhaust part 190 exhausts gases from the heat treatment space 65.

Figure 2:
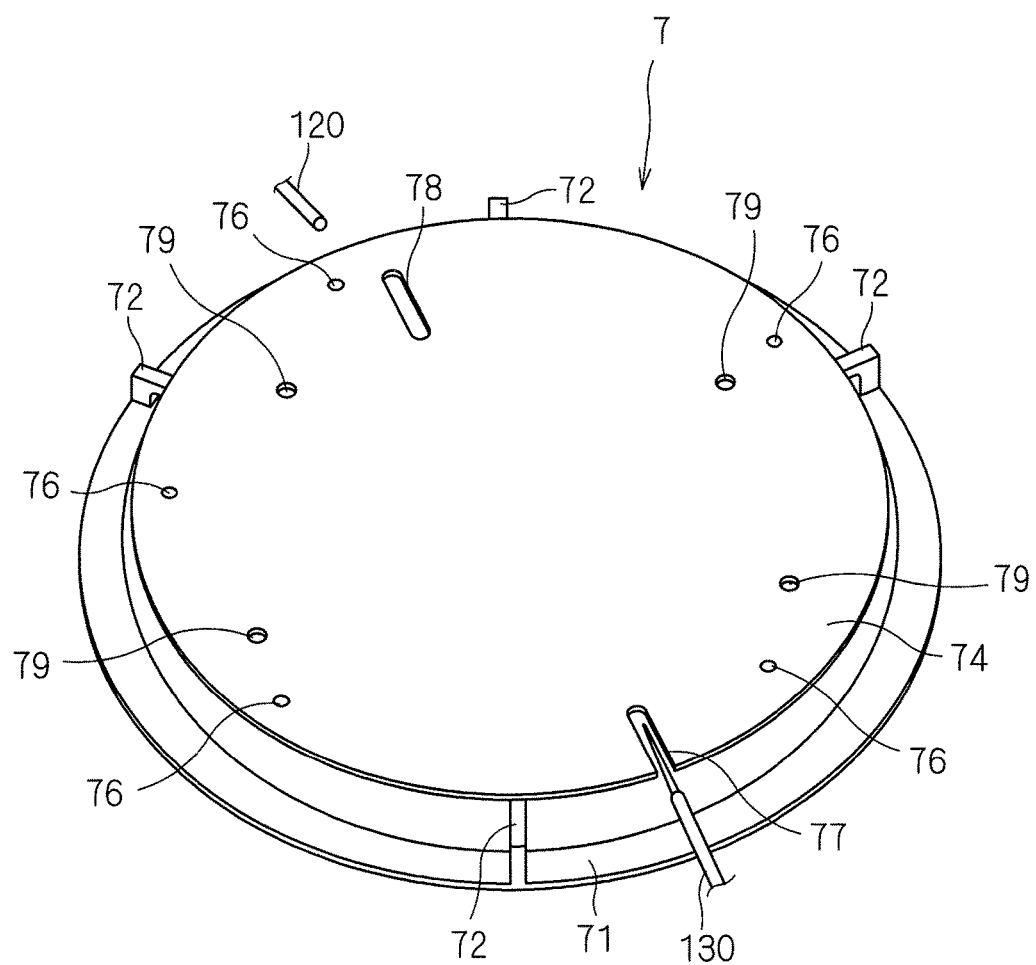
FIG. 2 is a perspective view of an overall external view of a holder.
Figure 3:
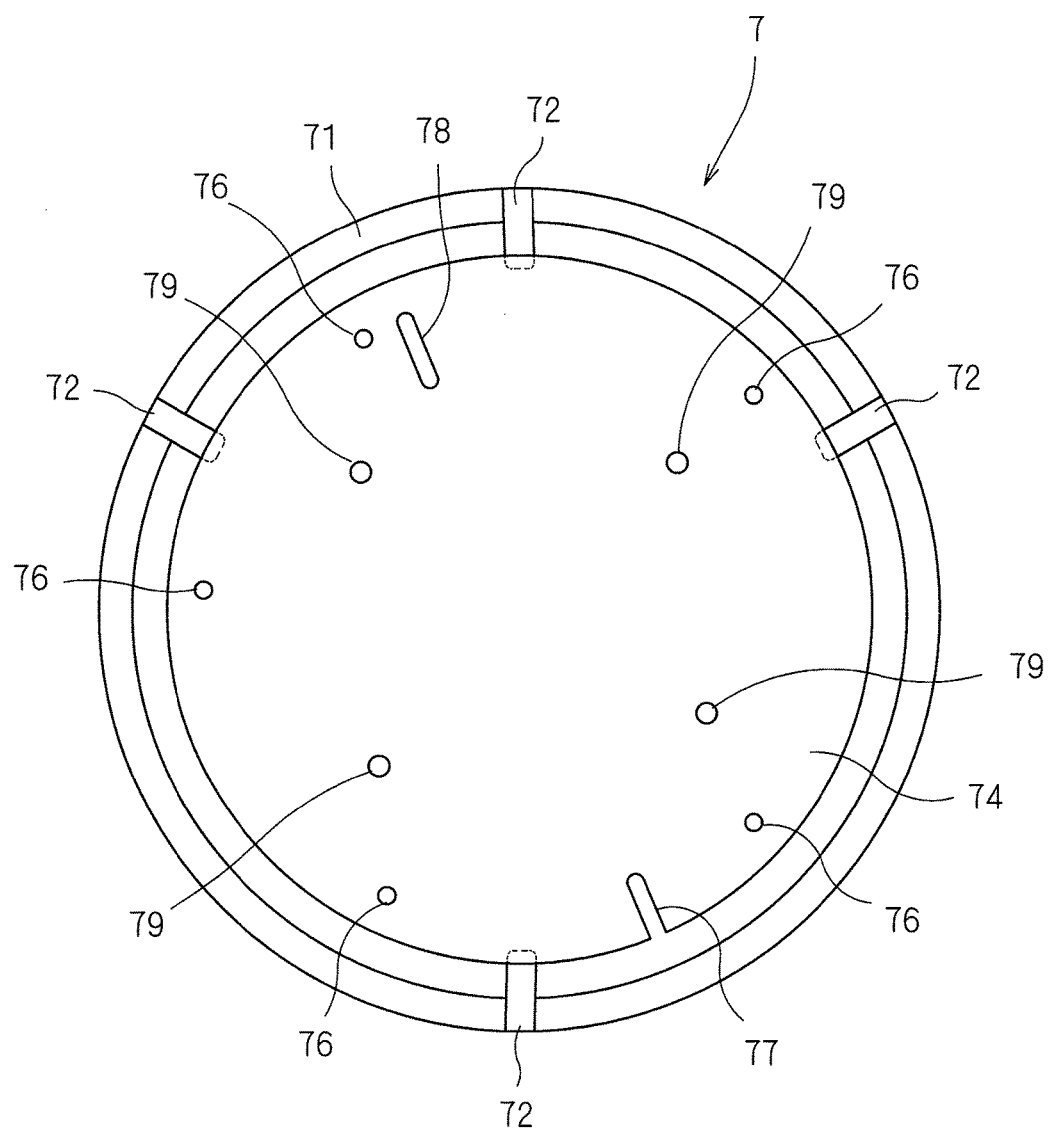
FIG. 3 is a plan view of the holder as viewed from above.

FIG. 2 is a perspective view illustrating an overall external view of the holder 7. FIG. 3 is a plan view of the holder 7 as viewed from above, and FIG. 4 is a side view of the holder 7 as viewed from one side. The holder 7 includes a base ring 71, connecting parts 72, and a susceptor 74. The base ring 71, the connecting parts 72, and the susceptor 74 are all made of quartz. That is, the entire holder 7 is made of quartz.

The base ring 71 is a quartz member having an annular shape. The base ring 71 is placed on the bottom face of the recessed portion 62 and thereby supported on the wall surface of the chamber 6 (see FIG. 1). On the upper surface of the annular base ring 71, a plurality of (in the present embodiment, four) connecting parts 72 are provided upright along the circumference of the base ring 71. The connecting parts 72 are also quartz members and fixedly attached to the base ring 71 by welding. Note that the base ring 71 may have an arc shape that is an annular shape with a missing part.

The flat plate-like susceptor 74 is supported by the four connecting parts 72 provided on the base ring 71. The susceptor 74 is a generally circular flat plate-like member made of quartz. The diameter of the susceptor 74 is greater diameter than that of the substrate W. That is, the susceptor 74 has a plane size greater than that of the substrate W. On the upper surface of the susceptor 74, a plurality of (in the present embodiment, five) guide pins 76 are provided upright. The five guide pins 76 are provided along the circumference of a circle that is concentric with the outer circumferential circle of the susceptor 74. The diameter of the circle along which the five guide pins 76 are disposed is slightly greater than that of the substrate W. Each guide pin 76 is also made of quartz. Note that the guide pins 76 may be made integrally with the susceptor 74 from a quartz ingot, or may be processed separately and attached to the susceptor 74 by methods such as welding.

The four connecting parts 72 provided upright on the base ring 71 and the underside of the peripheral portion of the susceptor 74 are fixedly attached to each other by welding. That is, the susceptor 74 and the base ring 71 are fixedly coupled to each other by the connecting parts 72, which makes the holder 7 an integral molding member of quartz. This base ring 71 of the holder 7 is supported on the wall surface of the chamber 6, and thereby the holder 7 is attached to the chamber 6. With the holder 7 attached to the chamber 6, the generally circular plate-like susceptor 74 is in a horizontal position (a position at which the normal coincides with the vertical direction). The substrate W transported into the chamber 6 is placed and held in a horizontal position on the susceptor 74 of the holder 7 attached to the chamber 6. The substrate W is placed on the inner side of the circle formed by the five guide pins 76, which prevents the substrate W from being shifted in the horizontal direction. Note that the number of guide pins 76 is not limited to five, and an arbitrary number of guide pins 76 may be provided as long as a shift in the position of the substrate W can be prevented.

As illustrated in FIGS. 2 and 3, the susceptor 74 has a vertically penetrating opening 78 and a cut-out portion 77. The cut-out portion 77 is provided to pass through the tip of a probe of a contact-type thermometer 130 using a thermocouple. On the other hand, the opening 78 is provided to allow a radiation thermometer 120 to receive radiation light (infrared light) emitted from the underside of the substrate W held by the susceptor 74. The susceptor 74 further has four through holes 79 that lift pins 12 of the transfer mechanism 1 (described later) pass through to carry the substrate W. Note that the wavelength range to be measured with the radiation thermometer 120 preferably does not include the absorption wavelength length of ammonia in the infrared region (in the neighborhood of 2 μm, in the neighborhood of 3 μm, and in the range of 5.5 to 7 μm) because the ammonia atmosphere is formed in the chamber 6 of the heat treatment apparatus 1.

Figure 5:
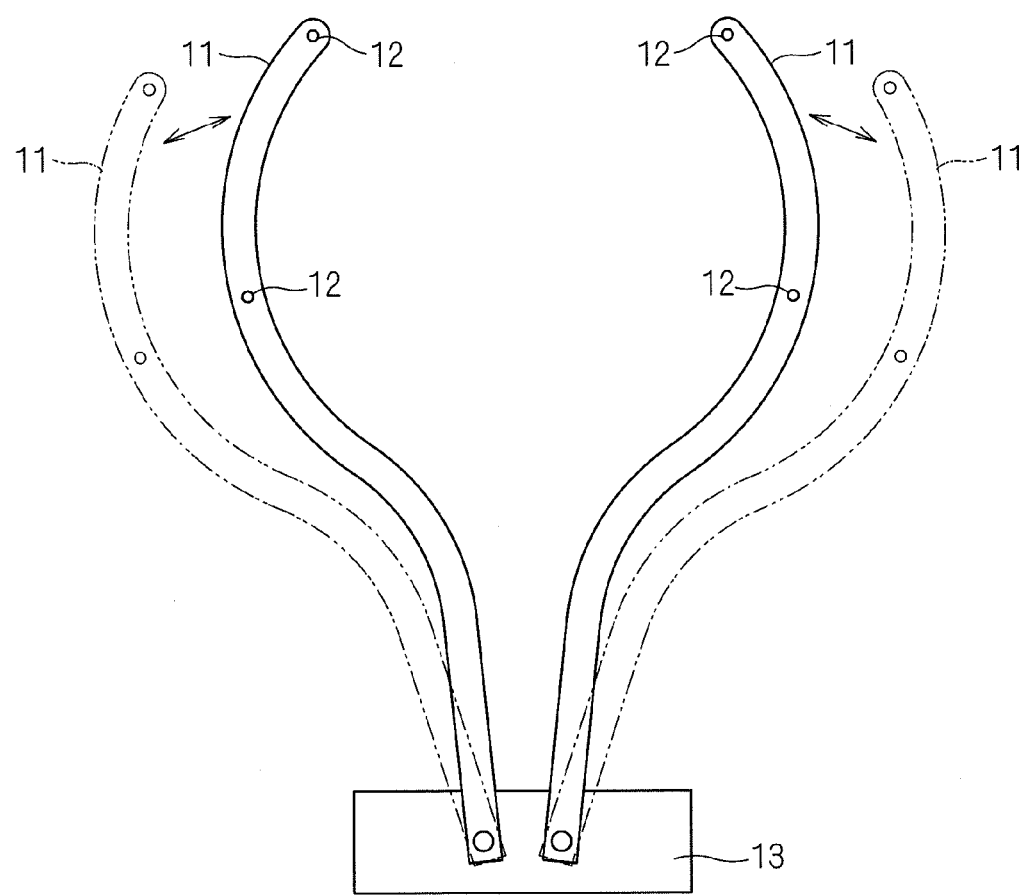
FIG. 5 is a plan view of a transfer mechanism.
Figure 6:
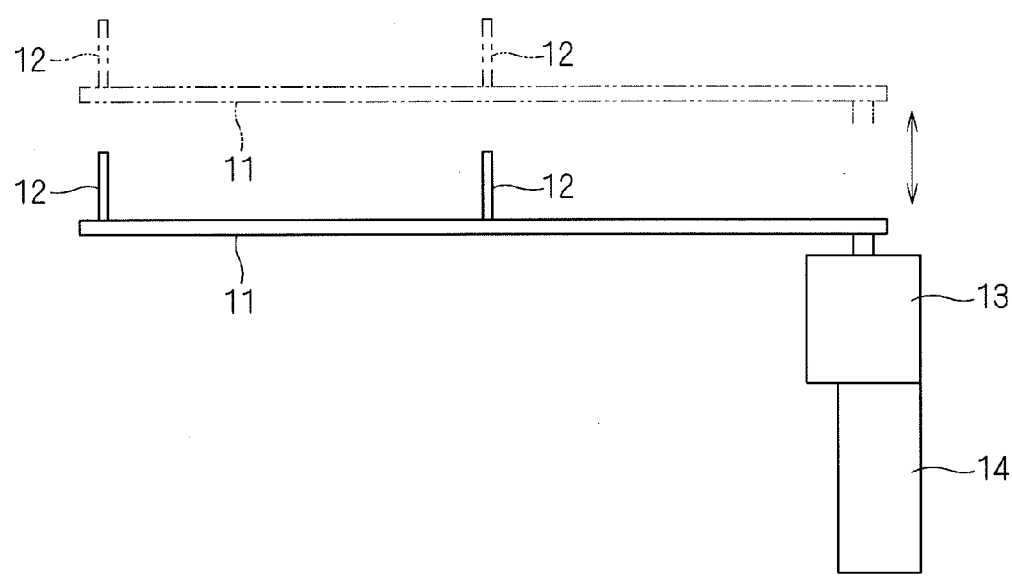
FIG. 6 is a side view of the transfer mechanism.

FIG. 5 is a plan view of the transfer mechanism 10. FIG. 6 is a side view of the transfer mechanism 10. The transfer mechanism 10 includes two transfer arms 11. The transfer arms 11 have an arc shape that extends substantially along the annular recessed portion 62. Each transfer arm 11 has two upright lift pins 12. Each transfer arm 11 is pivotable by a horizontal movement mechanism 13. The horizontal movement mechanism 13 horizontally moves the pair of transfer arms 11 between a transfer operation position (position indicated by the solid line in FIG. 5) at which the substrate W is transferred to the holder 7 and a retracted position (position indicated by the dashed double-dotted line in FIG. 5) at which the transfer arms 11 do not overlap the substrate W held on the holder 7 in plan view. The horizontal movement mechanism 13 may be a mechanism for separately pivoting the transfer arms 11 by separate motors, or may be a mechanism for using a link mechanism to pivot the pair of transfer arms 11 in conjunction with each other by a single motor.

The pair of transfer arms 11 are also elevated and lowered together with the horizontal movement mechanism 13 by an elevating mechanism 14. When the elevating mechanism 14 elevates the pair of transfer arms 11 at the transfer operation position, a total of four lift pins 12 pass through the through holes 79 (see FIGS. 2 and 3) formed in the susceptor 74, and the upper ends of the lift pins 12 protrude from the upper surface of the susceptor 74 On the other hand, when the elevating mechanism 14 lowers the pair of transfer arms 11 at the transfer operation position to pull the lift pins 12 out of the through holes 79, and the horizontal movement mechanism 13 moves the pair of transfer arms 11 to open the transfer arms 11, each transfer arm 11 moves to its retracted position. The retracted positions of the pair of transfer arms 11 are directly above the base ring 71 of the holder 7. Because the base ring 71 is placed on the bottom face of the recessed portion 62, the retracted positions of the transfer arms 11 are inside the recessed portion 62. Note that, in the vicinity of the area where the driving parts (the horizontal movement mechanism 13 and the elevating mechanism 14) of the transfer mechanism 10 are provided, an exhaust mechanism (not shown) is also provided so that the atmosphere around the driving parts of the transfer mechanism 10 is discharged to the outside of the chamber 6.

Referring back to FIG. 1, the flash heater 5 provided above the chamber 6 is configured to include, inside a casing 51, a light source having a plurality of (in the present embodiment, 30) xenon flash lamps FL and a reflector 52 that is provided to cover the top of the light source. The casing 51 of the flash heater 5 has a lamp-light radiation window 53 attached to the bottom. The lamp-light radiation window 53, which forms the floor of the flash heater 5, is a plate-like quartz window made of quartz. The lamp-light radiating window 53 is also made of the same synthetic quartz as that of the upper chamber window 63. Since the flash heater 5 is disposed above the chamber 6, the lamp-light radiation window 53 opposes the upper chamber window 63. The flash lamps FL apply flash light to the heat treatment space 65 from above the chamber 6 through the lamp-light radiation window 53 and the upper chamber window 63.

The flash lamps FL are each a rod-shaped lamp having an elongated cylindrical shape and are arranged in a planar array such that their longitudinal directions are parallel to each other along a major surface of the substrate W held by the holder 7 (i.e., in the horizontal direction). Thus, a plane formed by the array of the flash lamps FL is also a horizontal plane.

Figure 8:
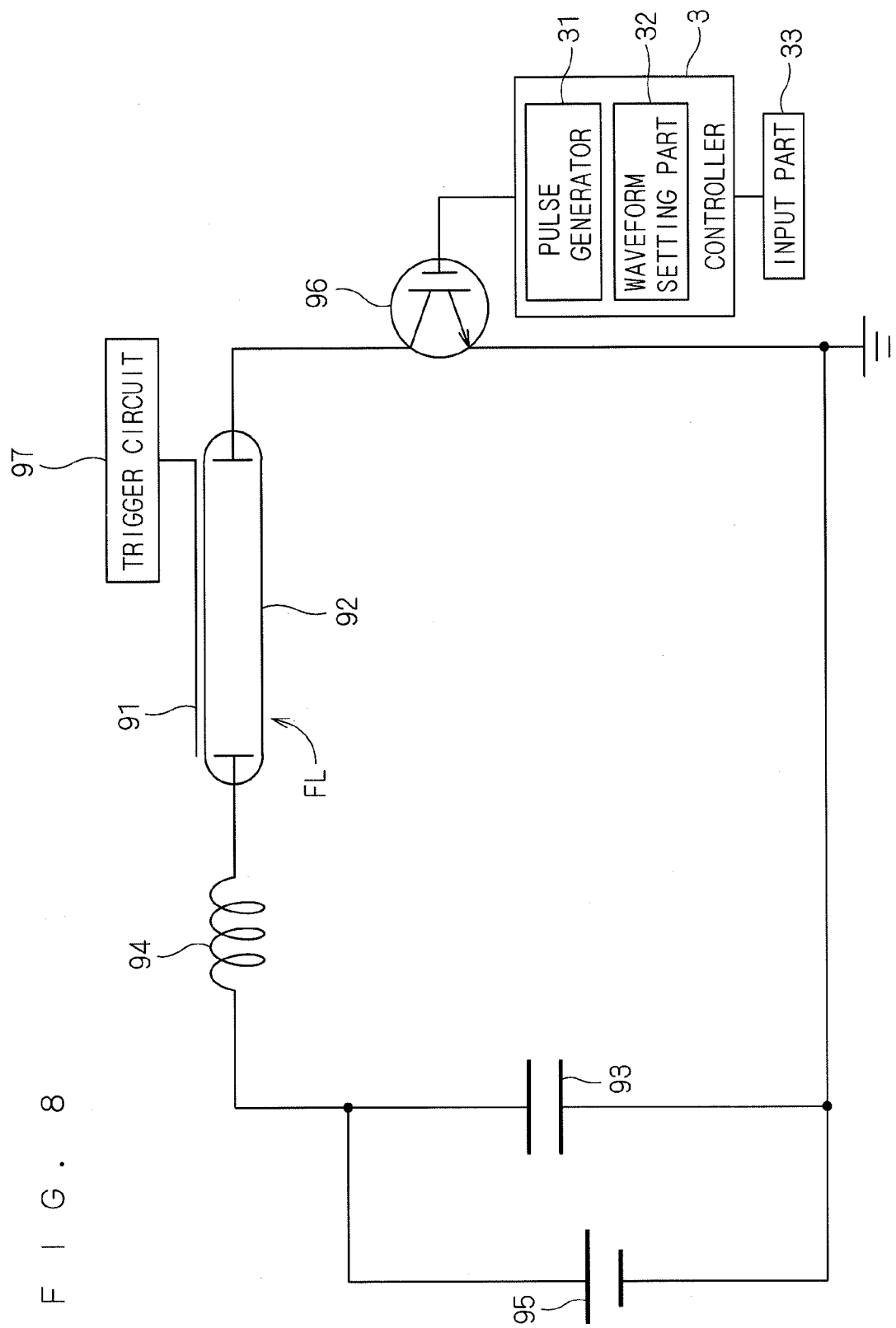
FIG. 8 illustrates a circuit for driving a flash lamp.

FIG. 8 illustrates a circuit for driving a flash lamp FL. As illustrated in FIG. 8, a capacitor 93, a coil 94, a flash lamp FL, and an insulating gate bipolar transistor (IGBT) 96 are connected in series. The controller 3 includes a pulse generator 31 and a waveform setting part 32 and is connected to an input part 33 as illustrated in FIG. 8. A variety of known input equipment such as a keyboard, a mouse, or a touch panel can be employed as the input part 33. The waveform setting part 32 sets the waveform of a pulse signal on the basis of the details of input from the input part 33, and the pulse generator 31 generates the pulse signal in accordance with that waveform.

The flash lamp FL includes a rod-shape glass tube (discharge tube) 92 that encapsulates a xenon gas and includes an anode and a cathode at opposite ends thereof, and a trigger electrode 91 provided on the outer circumferential surface of the glass tube 92. A predetermined voltage is applied from a power supply part 95 to the capacitor 93, and electric charge corresponding to the applied voltage (charging voltage) is accumulated in the capacitor 93. Also, a high voltage can be applied from a trigger circuit 97 to the trigger electrode 91. The timing of the voltage application from the trigger circuit 97 to the trigger electrode 91 is controlled by the controller 3. The IGBT 96 is a bipolar transistor in which a metal oxide semiconductor field effect transistor (MOSFET) is installed in the gate and that is a switching device suitable for handling a large amount of power. The pulse signal from the pulse generator 31 of the controller 3 is applied to the gate of the IGBT 96. When a voltage with a predetermined value or more (high voltage) is applied to the gate of the IGBT 96, the IGBT 96 is turned on, whereas when a voltage with less than the predetermined value (low voltage) is applied, the IGBT 96 is turned off. In this way, the driving circuit including the flash lamp FL is turned on or off by the IGBT 96. Turning the IGBT 96 on or off provides intermittent connection between the flash lamp FL and the corresponding capacitor 93.

Even when, with the capacitor 93 charged, the IGBT 96 is turned on and a high voltage is applied to the electrodes at the ends of the glass tube 92, no electricity flows through the glass tube 92 in a normal state because xenon gas is electrically an insulator. However, if an electrical breakdown is produced by the trigger circuit 97 applying a high voltage to the trigger electrode 91, discharges between the electrodes at the ends cause an instantaneous current flow in the glass tube 92, and light is emitted as a result of excitation of xenon atoms or molecules at that time.

Figure 9:
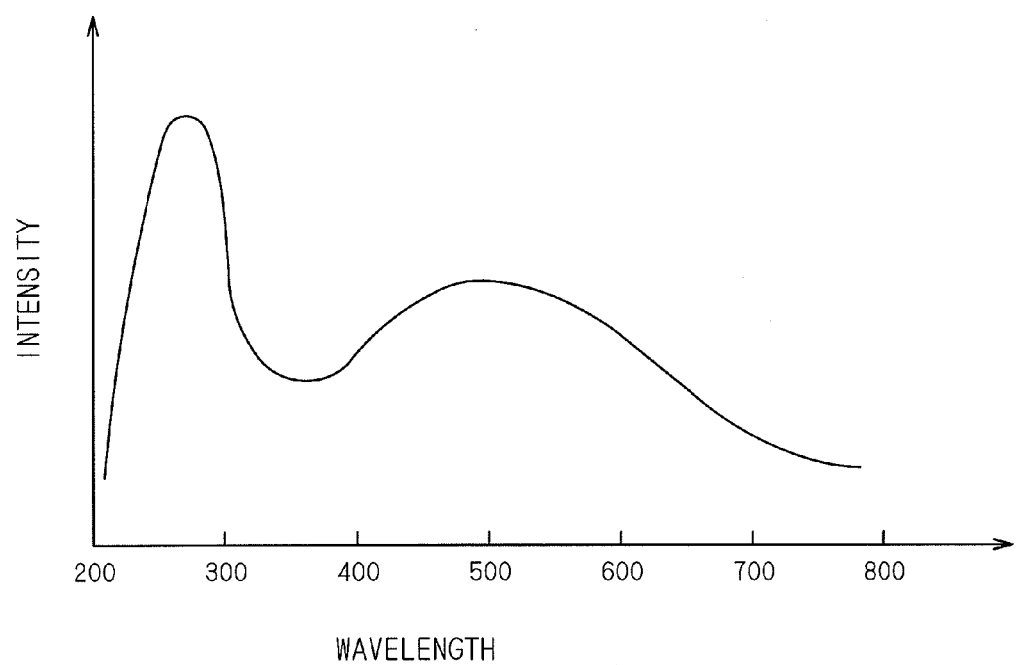
FIG. 9 illustrates a spectral distribution of flash light emitted from flash lamps.

The flash lamps FL of the present embodiment emit flash light that contains a relatively large number of wavelength components in the ultraviolet region. FIG. 9 illustrates a spectral distribution of the flash light emitted from the flash lamps FL. As illustrated in FIG. 9, the spectral distribution of the flash light emitted from the flash lamps FL of the present embodiment has a peak in a wavelength range of 200 to 300 nm. The spectral distribution of the flash light emitted from the flash lamps FL also shows that the relative intensity at the wavelength of 300 nm is 20% or more higher than that at the wavelength of 500 nm. The spectral distribution as illustrated in FIG. 9 can be obtained by adjusting components and pressure of the xenon gas encapsulated in the glass tube 92. Preferably, the glass tube 92 is also made of synthetic quartz having high transmittance in the ultraviolet region with wavelengths of 300 nm or less.

In the present embodiment, the lamp-light radiating window 53 and the upper chamber window 63, which pass through the flash light emitted from the flash lamps FL, are made of synthetic quart. Synthetic quartz has high transmittance even for ultraviolet rays having wavelengths of 300 nm or less. Consequently, the spectral distribution of the flash light emitted from the flash lamps FL and applied to the substrate W held in the chamber 6 has a peak in the wavelength range of 200 to 300 nm and shows that the relative intensity at the wavelength of 300 nm is 20% or more higher than that at the wavelength of 500 nm.

The reflector 52 shown in FIG. 1 is provided above the flash lamps FL to cover all of the flash lamps FL. A basic function of the reflector 52 is to reflect the light emitted from the flash lamps FL toward the holder 7. The reflector 52 is formed of an aluminum alloy plate and has a surface (a surface that faces the flash lamps FL) that is roughened by blasting.

The halogen heater 4 provided below the chamber 6 includes a plurality of (in the present embodiment, 40) built-in halogen lamps HL. The halogen lamps HL emit light by receiving the supply of electric power from the electric power supply circuit 45 and apply halogen light to the heat treatment space 65 from below the chamber 6 through the lower chamber window 64. The supply of electric power from the electric power supply circuit 45 is controlled by the controller 3. FIG. 7 is a plan view illustrating the arrangement of the halogen lamps HL. In the present embodiment, 20 halogen lamps HL are arranged in an upper row, and 20 halogen lamps HL are arranged in a lower row. Each halogen lamp HL is a rod-shaped lamp having an elongated cylindrical shape. The 20 halogen lamps HL in the upper row and the 20 halogen lamps HL in the lower row are arranged such that their longitudinal lengths are parallel to one another along the major surface of the substrate W held on the holder 7 (i.e., in the horizontal direction). Thus, both of the planes formed by the arrays of the halogen lamps HL in the upper and lower rows are horizontal planes.

As illustrated in FIG. 7, in both of the upper and lower rows, the density of arrangement of the halogen lamps HL in a region that opposes the peripheral portion of the substrate W held on the holder 7 is higher than that in a region that opposes the central portion of the substrate W. That is, in both of the upper and lower rows, the pitch of arrangement of the halogen lamps HL in the peripheral portion of the array of the halogen lamps HL is shorter than that in the central portion of the array. Thus, a greater amount of light can be applied to the peripheral portion of the substrate W where the temperature tends to drop during heating by the application of light from the halogen heater 4.

Also, a lamp group of the halogen lamps HL in the upper row and a lamp group of the halogen lamps HL in the lower row are arranged to intersect each other in a grid-like pattern. That is, a total of 40 halogen lamps HL is disposed such that the longitudinal lengths of the halogen lamps HL in the upper row and the longitudinal lengths of the halogen lamps HL in the lower row are orthogonal to each other.

The halogen lamps HL are filament-type light sources in which current is applied to a filament disposed in the glass tube to make the filament incandescent and emit light. The glass tube contains a gas that is prepared by introducing a trace amount of halogen elements (e.g., iodine or bromine) into inert gas such as nitrogen or argon. The introduction of halogen elements allows the temperature of the filament to be set to a high temperature while suppressing breakage of the filament. The halogen lamps HL thus have the characteristics of lasting longer than typical incandescent lamps and being able to continuously apply intense light. The halogen lamps HL, which are rod-shaped lamps, are long-life and have excellent efficiency of light emission to the substrate W located above the halogen lamps when arranged in the horizontal direction.

As illustrated in FIG. 1, the heat treatment apparatus 1 includes the shutter mechanism 2 laterally to the halogen heater 4 and the chamber 6. The shutter mechanism 2 includes a shutter plate 21 and a slide driving mechanism 22. The shutter plate 21 is a plate opaque to halogen light and is made of titanium (Ti), for example. The slide driving mechanism 22 slides and moves the shutter plate 21 in the horizontal direction to insert or retract the shutter plate 21 into or from a light-shield position between the halogen heater 4 and the holder 7. When the slide driving mechanism 22 moves the shutter plate 21 forward, the shutter plate 21 is inserted into the light-shield position (position indicated by the dashed double-dotted line in FIG. 1) between the chamber 6 and the halogen heater 4 and becomes an obstruction between the lower chamber window 64 and the halogen lamps HL. This provides blockage of the light emitted from the halogen lamps HL toward the holder 7 in the heat treatment space 65. Conversely, when the slide driving mechanism 22 moves the shutter plate 21 backward, the shutter plate 21 is retracted from the light-shield position between the chamber 6 and the halogen heater 4 and opens the bottom of the lower chamber window 64.

The controller 3 controls the above-described various operating mechanisms provided in the heat treatment apparatus 1. The hardware configuration of the controller 3 is the same as that of a commonly used computer. More specifically, the controller 3 includes a CPU that is a circuit for performing various types of computation processing, a ROM that is a read-only memory for storing basic programs, a RAM that is a readable and writable memory for storing various types of information, and a magnetic disk for storing control software and data. The processing in the heat treatment apparatus 1 proceeds as a result of the CPU of the controller 3 executing a predetermined processing program. The controller 3 further includes the pulse generator 31 and the waveform setting part 32 as illustrated in FIG. 8. As described above, the waveform setting part 32 sets the waveform of a pulse signal on the basis of the details of input received from the input part 33, and the pulse generator 31 outputs the pulse signal to the gate of the IGBT 96 in accordance with that waveform. The controller 3 further adjusts the atmosphere in the chamber 6 by controlling the opening and closing of each valve used to supply or exhaust gases to or from the chamber 6, and controls the emission of light from the halogen lamps HL by controlling the electric power supply circuit 45.

In addition to the above-described constituent elements, the heat treatment apparatus 1 also includes various cooling structures in order to prevent the temperatures of the halogen heater 4, the flash heater 5, and the chamber 6 from excessively increasing due to heat energy generated from the halogen lamps HL and the flash lamps FL during heat treatment of the substrate W. For example, a water-cooled tube (not shown) is provided in the wall of the chamber 6. Also, the halogen heater 4 and the flash heater 5 form an air cooling structure in which a gas flow is produced to exhaust heat. Moreover, air is supplied to the space between the upper chamber window 63 and the lamp-light radiation window 53 to cool the flash heater 5 and the upper chamber window 63.

Figure 11:
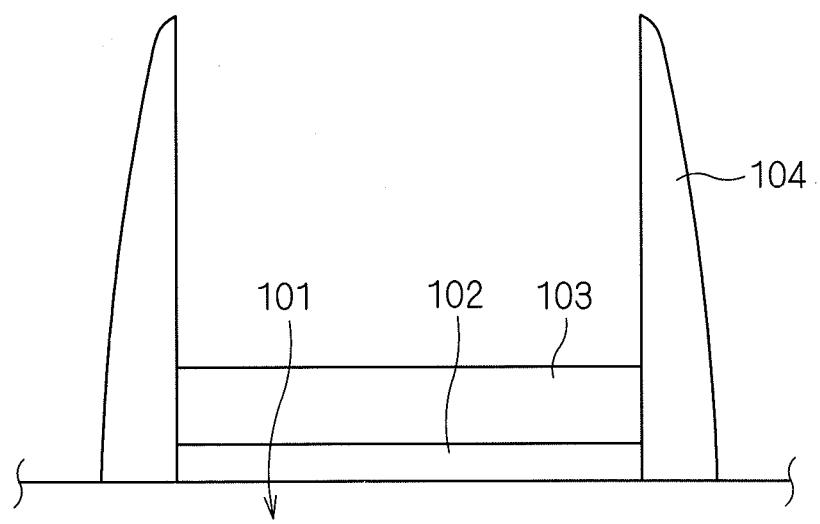

Next, a procedure of processing performed on the substrate W will be described. FIG. 10 is a flowchart illustrating a procedure of processing for forming a gate on the substrate W. Steps S14 to S18 in FIG. 10 are processes executed by the heat treatment apparatus 1. FIG. 11 illustrates a stacked structure in which the high-dielectric-constant gate insulator 103 is formed on a base material 101 for the substrate W with the interface layer film 102 sandwiched in between. Hereinafter, the procedure of processing performed on the substrate W will be described with reference to FIG. 11 as appropriate. First, pre-processing is performed on the substrate W as a preparation for forming the gate (step S11). This pre-processing is a cleaning process for cleaning the surface of the substrate W with a cleaning fluid. The cleaning fluid includes deionized water and chemical solutions such as an SC-1 solution (a mixed solution of aqueous ammonia, a hydrogen peroxide solution, and water), an SC-2 solution (a mixed solution of hydrochloric acid, a hydrogen peroxide solution, and water), and a DHF solution (dilute hydrofluoric acid). The cleaning process is performed by supplying such a cleaning fluid to the surface of the substrate W. Note that the method used in the cleaning process may be batch cleaning in which the cleaning process is performed collectively on a plurality of substrates W, or may be single-wafer cleaning in which substrates W are processed one at a time.

Next, the interface layer film 102 is formed on the base material 101 for the substrate W (step S12). When the base material 101 is silicon, the interface layer film 102 is typically $SiO_2$. The method for forming the interface layer film 102 may be a variety of well-known methods such as thermal oxidation.

Then, the high-dielectric-constant gate insulator 103 is formed on the interface layer film 102 (step S13). The high-dielectric-constant gate insulator 103 may, for example, be $HfO_2$, $ZrO_2$, $Al_2O_3$, or $La_2O_3$ (in the present embodiment, $HfO_2$). The high-dielectric-constant gate insulator 103 is formed by, for example, depositing a high dielectric constant material on the interface layer film 102 by atomic layer deposition (ALD). The thickness of the high-dielectric-constant gate insulator 103 to be deposited on the interface layer film 102 is several nanometers (nm), but the equivalent oxide thickness (EOT) is approximately 1 nm. The method for forming the high-dielectric-constant gate insulator 103 is not limited to ALD, and may, for example, be other known methods such as metal organic chemical vapor deposition (MOCVD). With any method, the high-dielectric-constant gate insulator 103 contains a large number of defects such as point defects if no special processing is performed on the initially deposited high-dielectric-constant gate insulator 103. Note that, in the structure illustrated in FIG. 11, SiN sidewalls 104 are formed on both sides of the high-dielectric-constant gate insulator 103, for example, prior to the formation of the high-dielectric-constant gate insulator 103 in a gate last process.

The heat treatment apparatus 1 performs heat treatment on this substrate W in which the high-dielectric-constant gate insulator 103 is formed on the base material 101 with the interface layer film 102 sandwiched in between. Hereinafter, a procedure of operations performed by the heat treatment apparatus 1 will be described. The procedure of operations performed by the heat treatment apparatus 1 proceeds as a result of the controller 3 controlling the operation mechanisms of the heat treatment apparatus 1.

First, the substrate W with the high-dielectric-constant gate insulator 103 formed on the interface layer film 102 is transported into the chamber 6 of the heat treatment apparatus 1 (step S14). For the transport of the substrate W, the gate valve 85 opens and opens up the transport opening 66, and a transport robot disposed outside of the apparatus transports the substrate W including the high-dielectric-constant gate insulator 103 into the heat treatment space 65 of the chamber 6 through the transport opening 66. At this time, the flow of the atmosphere outside the apparatus into the chamber 6 may be minimized by opening the valve 183 and continuing to supply nitrogen gas into the chamber 6 such that a stream of nitrogen gas flows out of the transport opening 66. The substrate W transported inside by the transport robot is conveyed to a position immediately above the holder 7 and stopped. Then, the pair of transfer arms 11 of the transfer mechanism 10 horizontally moves from the retracted position to the transfer operation position and then moves upward so that the lift pins 12 protrude from the upper surface of the susceptor 74 through the through holes 79 to receive the substrate W.

After the substrate W is placed on the lift pins 12, the transport robot withdraws from the heat treatment space 65, and the transport opening 66 is closed by the gate valve 85. Then, the pair of transfer arms 11 is lowered so that the substrate W is transferred from the transfer mechanism 10 to the susceptor 74 of the holder 7 and held in a horizontal position. The substrate W is held by the susceptor 74 with the surface where the high-dielectric-constant gate insulator 103 is formed facing up. The substrate W is held on the inner side of the five guide pins 76 on the upper surface of the susceptor 74. The pair of transfer arms 11 that has moved down to below the susceptor 74 is retracted to the retracted positions, i.e., to the inside of the recessed portion 62, by the horizontal movement mechanism 13.

After the substrate W is housed in the chamber 6, an ammonia atmosphere is formed in the chamber 6 (step S15). More specifically, gases are exhausted from the heat treatment space 65 by opening the valve 89, and a mixed gas of ammonia and nitrogen gas serving as dilute gas is supplied from the gas supply port 81 to the heat treatment space 65 by opening the valves 183 and 187. Consequently, an ammonia atmosphere is formed around the substrate W held in the chamber 6 by the holder 7. The concentration of ammonia in the ammonia atmosphere (i.e., a mixing ratio of ammonia and nitrogen gas) is determined by the flow control valves 181 and 186. In the present preferred embodiment, the flow rates of ammonia and nitrogen gas are adjusted by the flow control valves 186 and 181 so that the concentration of ammonia in the ammonia atmosphere becomes approximately 2.5 vol %. Note that it is sufficient for the concentration of ammonia in the ammonia atmosphere to be 10 vol % or less.

Along with the formation of the ammonia atmosphere in the chamber 6, the 40 halogen lamps HL of the halogen heater 4 are all turned on in unison to start preheating (assist-heating) of the substrate W (step S16). The halogen light emitted from the halogen lamps HL passes through the lower chamber window 64 and the susceptor 74, which are made of quartz, and is applied to the substrate W from the rear surface side. The rear surface of the substrate W is a main surface on the side opposite the front surface where the high-dielectric-constant gate insulator 103 is formed. The application of light from the halogen lamps HL increases the temperature of the substrate W. Note that the transfer arms 11 of the transfer mechanism 10, which have already retracted into the recessed portion 62, will not impede the heating using the halogen lamps HL.

During preheating with the halogen lamps HL, the temperature of the substrate W is measured with the contact-type thermometer 130. That is, the contact-type thermometer 130 with a built-in thermocouple comes in contact with the lower surface of the substrate W held by the susceptor 74 through the cut-out portion 77 and measures the increasing temperature of the substrate. The measured temperature of the substrate W is transmitted to the controller 3. The controller 3 controls the output of the halogen lamps HL while monitoring whether the temperature of the substrate W that is being increased by the application of light from the halogen lamps HL has reached a predetermined preheating temperature T1. That is, the controller 3 performs feedback control of the electric power supply circuit 45 on the basis of the measured value obtained from the contact-type thermometer 130 and adjusts the intensities of the halogen lamps HL so that the temperature of the substrate W becomes the preheating temperature T1. The preheating temperature T1 is higher than or equal to 300° C. and lower than or equal to 600° C., and in the present embodiment, 450° C. Note that the radiation thermometer 120 does not measure temperature when the temperature of the substrate W is being increased by the application of light from the halogen lamps HL. This is because precise temperature measurement is not possible with the halogen light from the halogen lamps HL entering the radiation thermometer 120 as disturbance light.

After the temperature of the substrate W has reached the preheating temperature T1, the controller 3 temporarily maintains the substrate W at the preheating temperature T1 for a while. More specifically, when the temperature of the substrate W measured with the contact-type thermometer 130 has reached the preheating temperature T1, the controller 3 controls the electric power supply circuit 45 to adjust the intensities of the halogen lamps HL and to maintain the temperature of the substrate W at approximately the preheating temperature T1.

Such preheating using the halogen lamps HL allows the temperature of the entire substrate W including the high-dielectric-constant gate insulator 103 and the interface layer film 102 to uniformly increase to the preheating temperature T1. In the preheating stage using the halogen lamps HL, the temperature of the peripheral portion of the substrate W where heat dissipation is likely to occur tends to decrease to a lower temperature than that of the central portion. However, the density of arrangement of the halogen lamps HL in the region of the halogen heater 4 that opposes the peripheral portion of the substrate W is higher than that in the region that opposes the central portion of the substrate W. Thus, a greater amount of light is applied to the peripheral portion of the substrate W where heat dissipation is likely to occur. This makes uniform an in-plane temperature distribution of the substrate W in the preheating stage. Moreover, the mirror-finished inner circumferential surface of the reflection ring 69 attached to the chamber side portion 61 increases the amount of light to be reflected by the inner circumferential surface of the reflection ring 69 toward the peripheral portion of the substrate W, thus making more uniform the in-plane temperature distribution of the substrate W in the preheating stage.

Next, when a predetermined amount of time has elapsed after the temperature of the substrate W had reached the preheating temperature T1, a flash heating process is executed by applying flash light from the flash lamps FL (step S17). For the application of flash light from the flash lamps FL, a charge is accumulated in the capacitor 93 in advance by the power supply part 95. Then, with the capacitor 93 charged, a pulse signal is output from the pulse generator 31 of the controller 3 to the IGBT 96 to drive the IGBT 96 between on or off.

The waveform of the pulse signal can be determined by inputting, from the input part 33, a set of instructions that sequentially sets a time of pulse width (ON time) and a time of pulse spacing (OFF time) as parameters. When an operator inputs such a set of instructions from the input part 33 to the controller 3, the waveform setting part 32 of the controller 3 sets a pulse waveform that repeats turning on and off in accordance with the instructions. Then, the pulse generator 31 outputs a pulse signal in accordance with the pulse waveform set by the waveform setting part 32. Consequently, a pulse signal having the set waveform is applied to the gate of the IGBT 96, and the IGBT 96 is controlled and driven between on and off. More specifically, when the pulse signal inputted to the gate of the IGBT 96 is ON, the IGBT 96 is turned on, whereas when the pulse signal is OFF, the IGBT 96 is turned off.

In synchronization with the timing of turn-on of the pulse signal output from the pulse generator 31, the controller 3 controls the trigger circuit 97 to apply a high voltage (trigger voltage) to the trigger electrode 91. Since a pulse signal is input to the gate of the IGBT 96 in the state where the capacitor 93 is charged, and a high voltage is applied to the trigger electrode 91 in synchronization with the timing of turn-on of the pulse signal, current certainly flows between the electrodes at the ends of the glass tube 92 when the pulse signal is ON, and light is emitted as a result of excitation of xenon atoms or molecules at that time.

In this way, the flash lamps FL emit flash light, and the flash light is applied to the surface of the substrate W held by the holder 7. The spectral distribution of the flash light emitted from the flash lamps FL of the present embodiment has a peak in a wavelength range of 200 to 300 nm, and shows that the relative intensity at the wavelength of 300 nm is 20% or more higher than that at the wavelength of 500 nm (FIG. 9). The lamp-light radiating window 53 and the upper chamber window 63, which pass through the flash light emitted from the flash lamps FL, are made of synthetic quartz. Thus, flash light containing a relatively large number of wavelength components in the ultraviolet region is applied to the surface of the substrate W including the high-dielectric-constant gate insulator 103. More specifically, the flash light applied to the high-dielectric-constant gate insulator 103 has a spectral distribution that has a peak in the wavelength lengths of 200 to 300 nm and shows that the relative intensity at the wavelength of 300 nm is 20% or more higher than that at the wavelength of 500 nm.

Here, if the IGBT 96 is not used for light emission from the flash lamps FL, the charge accumulated in the capacitor 93 is consumed by a single light emission, and the output waveform of the light from the flash lamps FL has a single pulse of approximately 0.1 to 10 milliseconds. On the contrary, in the present preferred embodiment in which the IGBT 96 serving as a switching device is connected to the circuit and a pulse signal is output to the gate of the IGBT 96, the IGBT 96 intermittently continues the supply of charge from the capacitor 93 to the flash lamps FL and controls the amount of current flowing to the flash lamps FL. Consequently, the light emission from the flash lamps FL is chopper-controlled. In this case, the charge accumulated in the capacitor 93 is divided and consumed, and the flash lamps FL repeatedly blink in a very short time. Note that the emission output does not become completely zero even during blinking of the flash lamps FL because the next pulse will be applied to the gate of the IGBT 96 and the current value will increase again before the value of current flowing through the circuit becomes completely zero. Accordingly, the light emission pattern of the flash lamps FL can be freely determined by the IGBT 96 intermittently continuing the supply of charge to the flash lamps FL, and therefore the light emission time and the light emission intensity can be adjusted freely. The time for which the flash lamps FL emit flash light, which is adjusted by the IGBT 96, is 0.2 milliseconds or more and one second or less, and in the present embodiment, three milliseconds.

By applying flash light from the flash lamps FL to the surface of the substrate W in which the high-dielectric-constant gate insulator 103 is formed on the base material 101 with the interface layer film 102 sandwiched in between, the temperature at the surface of the substrate W including the high-dielectric-constant gate insulator 103 momentarily increases up to a processing temperature T2. The processing temperature T2, which is a maximum temperature (peak temperature) at which the surface of the substrate W reaches by the application of flash light, is 600° C. or more and 1200° C. or less, and in the present embodiment, 1000° C. When the temperature at the surface of the substrate W is increased to the processing temperature T2 in the ammonia atmosphere, nitriding of the high-dielectric-constant gate insulator 103 is accelerated. Note that, since the time for which light is emitted from the flash lamps FL is a very short time, as short as one second or less, the time required for the surface temperature of the substrate W to increase from the preheating temperature T1 to the processing temperature T2 is also an extremely short time of less than one second.

Figure 12:
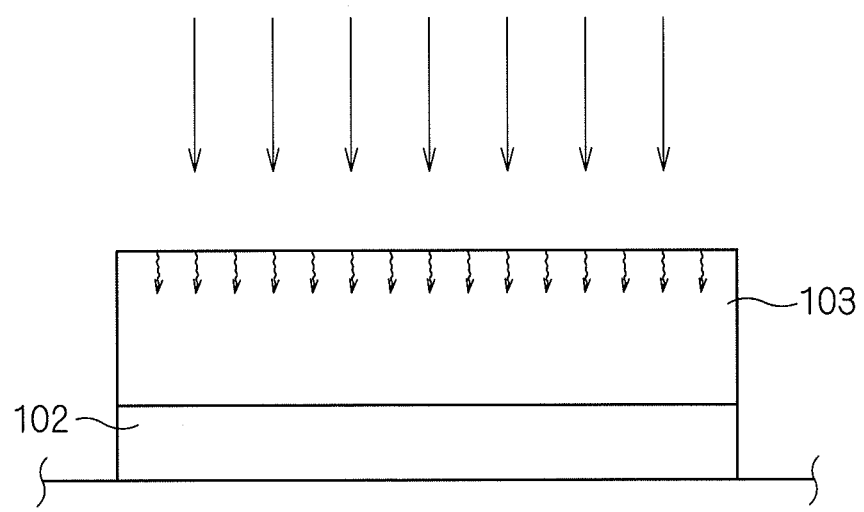
FIG. 12 illustrates nitriding of the high-dielectric-constant gate insulator by flash heating.

FIG. 12 illustrates nitriding of the high-dielectric-constant gate insulator 103 in the flash heating process. The high-dielectric-constant gate insulator 103 is heated to the processing temperature T2 by the application of flash light in the ammonia atmosphere. This causes nitrogen atoms to penetrate through the surface of the high-dielectric-constant gate insulator 103 (surface on the side opposite the surface interface layer film 102 and where the flash light is applied) and allows nitriding to proceed. However, since the time for which the flash lamps FL emit flash light is an extremely short time ranging from 0.2 milliseconds to one second, flash heating does not cause nitriding of the entire high-dielectric-constant gate insulator 103, and the penetration of nitrogen atoms remains in part of the region that is located at a predetermined depth from the surface of the high-dielectric-constant gate insulator 103. That is, nitriding does not reach the interface layer film 102 formed as the base of the high-dielectric-constant gate insulator 103, and consequently, nitriding of the interface layer film 102 can be suppressed.

Light having energy necessary to cause electrons to transition across the bandgap of the high-dielectric-constant gate insulator 103 of $HfO_2$ has a wavelength of 300 nm or less. That is, the high-dielectric-constant gate insulator 103 exhibits high absorption characteristics for ultraviolet rays, which have wavelengths of 300 nm or less. When flash light containing a relatively large amount of wavelength components in the ultraviolet region is applied to the high-dielectric-constant gate insulator 103 as in the present embodiment of the present invention, the high-dielectric-constant gate insulator 103 efficiently absorbs the flash light, whereas no flash light passes through the high-dielectric-constant gate insulator 103 and reaches the interface layer film 102 serving as a base. Accordingly, only the high-dielectric-constant gate insulator 103 can be heated without heating the interface layer film 102 formed as the base. This further accelerates nitriding of the high-dielectric-constant gate insulator 103.

Ammonia also has high absorption characteristics for ultraviolet rays. Thus, when flash light containing a relatively large number of wavelength components in the ultraviolet region is applied in an ammonia atmosphere, ammonia molecules are also activated by absorbing the flash light. This further accelerates nitriding of the high-dielectric-constant gate insulator 103.

When the application of flash light from the flash lamps FL has ended, the IGBT 96 is turned off, the light emission from the flash lamps FL stops, and the surface temperature of the substrate W rapidly drops from the processing temperature T2. The halogen lamps HL are also turned off, causing the substrate W to drop even from the preheating temperature T1. After the process of heating the substrate W has ended, only the valve 187 is closed to change the atmosphere in the chamber 6 into a nitrogen gas atmosphere. Simultaneously with the turn-off of the halogen lamps HL, the shutter mechanism 2 inserts the shutter plate 21 into the light-shield position between the halogen heater 4 and the chamber 6. Even after the turn-off of the halogen lamps HL, the temperatures of the filaments and the tube walls do not drop immediately, and radiant heat continues to be emitted from high-temperature filaments and tube walls after a while, preventing a temperature drop in the substrate W. Such radiant heat that is emitted immediately after turn-off from the halogen lamps HL to the heat treatment space 65 is blocked off by inserting the shutter plate 21. This increases the rate of a temperature drop in the substrate W.

The radiation thermometer 120 starts measuring temperature when the shutter plate 21 is inserted into the light-shield position. That is, the radiation thermometer 120 measures the intensity of infrared light emitted from the lower surface of the substrate W held by the holder 7 through the opening 78 of the susceptor 74 to measure the dropping temperature of the substrate W. The measured temperature of the substrate W is transmitted to the controller 3.

Although somewhat radiation continues to be emitted from the high-temperature halogen lamps HL immediately after turn-off, the radiation thermometer 120 only measures the temperature of the substrate W when the shutter plate 21 is inserted in the light-shield position, and therefore, the radiation from the halogen lamps HL toward the heat treatment space 65 of the chamber 6 is blocked off. The radiation thermometer 120 can thus precisely measure the temperature of the substrate W held by the susceptor 74 without being affected by disturbance light. Since the wavelength range measured with the radiation thermometer 120 does not include the absorption wavelength range of ammonia in the infrared region, this prevents ammonia remaining in the chamber 6 from interfering with the measurement of the temperature of the substrate W.

The controller 3 monitors whether or not the temperature of the substrate W measured with the radiation thermometer 120 has dropped to a predetermined temperature. After the temperature of the substrate W has dropped to the predetermined temperature, the pair of transfer arms 11 again horizontally moves from the retracted positions to the transfer operation positions and then moves upward so that the lift pins 12 protrude from the upper surface of the susceptor 74 and receive the heat-treated substrate W from the susceptor 74. Then, the transport opening 66 that has been closed by the gate valve 85 is opened, and the substrate W placed on the lift pins 12 is transported out by the transport robot disposed outside the apparatus (step S18). This completes the process of heating the substrate W, performed by the heat treatment apparatus 1.

After the heat treatment apparatus 1 has completed the procedure, a metal gate is deposited on the nitrided high-dielectric-constant gate insulator 103 (step S19). The material for the gate electrode is, for example, titanium (Ti) or titanium-containing nitride (TiN).

In the present embodiment, the process of nitriding the high-dielectric-constant gate insulator 103 is performed by heating the high-dielectric-constant gate insulator 103 in an ammonia atmosphere to the processing temperature T2 by the application of flash light in the ammonia atmosphere for an emission time of 0.2 milliseconds to one second from the flash lamps FL to the surface of the substrate W in which the high-dielectric-constant gate insulator 103 is formed on the base material 101 with the interface layer film 102 sandwiched in between. Nitriding of the high-dielectric-constant gate insulator 103 reduces defects in the deposited high-dielectric-constant gate insulator 103, thus suppressing leakage current due to such defects.

Additionally, the time for which the flash lamps FL emit flash light is an extremely short time, as short as 0.2 milliseconds to one second. This prevents nitriding of the interface layer film 102 formed as the base of the high-dielectric-constant gate insulator 103. It is thus possible to prevent a reduction in the mobility of carriers due to nitriding of the interface layer film 102 and to prevent an increase in EOT.

Nitriding of the high-dielectric-constant gate insulator 103 requires high-temperature heating of the high-dielectric-constant gate insulator 103 in an ammonia atmosphere. With conventional techniques such as a rapid thermal process (RTP) for heating the high-dielectric-constant gate insulator 103, the temperature of the high-dielectric-constant gate insulator 103 is increased for several seconds. In this case, even the interface layer film 102 serving as the base of the high-dielectric-constant gate insulator 103 is nitrided and degraded, resulting in a considerably decrease in the mobility of carriers and an increase in EOT.

In the present embodiment, the high-dielectric-constant gate insulator 103 is heated for an extremely short time by the application of flash light in an ammonia atmosphere. This accelerates nitriding of the high-dielectric-constant gate insulator 103 while suppressing nitriding of the interface layer film 102. In other words, this indicates that the high-dielectric-constant gate insulator 103 can be heated to such a high temperature that enables nitriding if the high-dielectric-constant gate insulator 103 is heated for an extremely short time by the application of flash light.

In the spectral distribution of flash light emitted from conventional flash lamps, light in the visible light range is a primary component and passes through ammonia without being absorbed. Thus, conventional flash lamps cannot activate ammonia and may interfere with the progress of nitriding of the high-dielectric-constant gate insulator.

The spectral distribution of the flash light emitted from the flash lamps FL of the present preferred embodiment has a peak in the wavelength range of 200 to 300 nm and shows that the relative intensity at the wavelength of 300 nm is 20% or more higher than that at the wavelength of 500 nm. Also, the high-dielectric-constant gate insulator 103 and ammonia in the atmosphere have high absorption characteristics for ultraviolet rays. Thus, applying the flash light containing a relatively large number of wavelength components in the ultraviolet region allows the high-dielectric-constant gate insulator 103 and ammonia molecules to efficiently absorb the flash light and be activated, consequently reliably accelerating nitriding of the high-dielectric-constant gate insulator 103.

While the above has been a description of a preferred embodiment of the present invention, various modifications in addition to those described above may be made to the present invention without departing from the scope and spirit of the invention. For example, while the ammonia atmosphere is formed in the chamber 6 under normal atmospheric pressure in the above-described preferred embodiment, instead of this, an ammonia atmosphere may be formed while maintaining the inside of the chamber 6 under reduced pressure of less than atmospheric pressure. If flash heating is performed with an ammonia atmosphere formed in the chamber 6 under reduced pressure in which the mean free path becomes longer than under normal atmospheric pressure, the nitriding of the high-dielectric-constant gate insulator 103 can be reliably accelerated.

Figure 13:
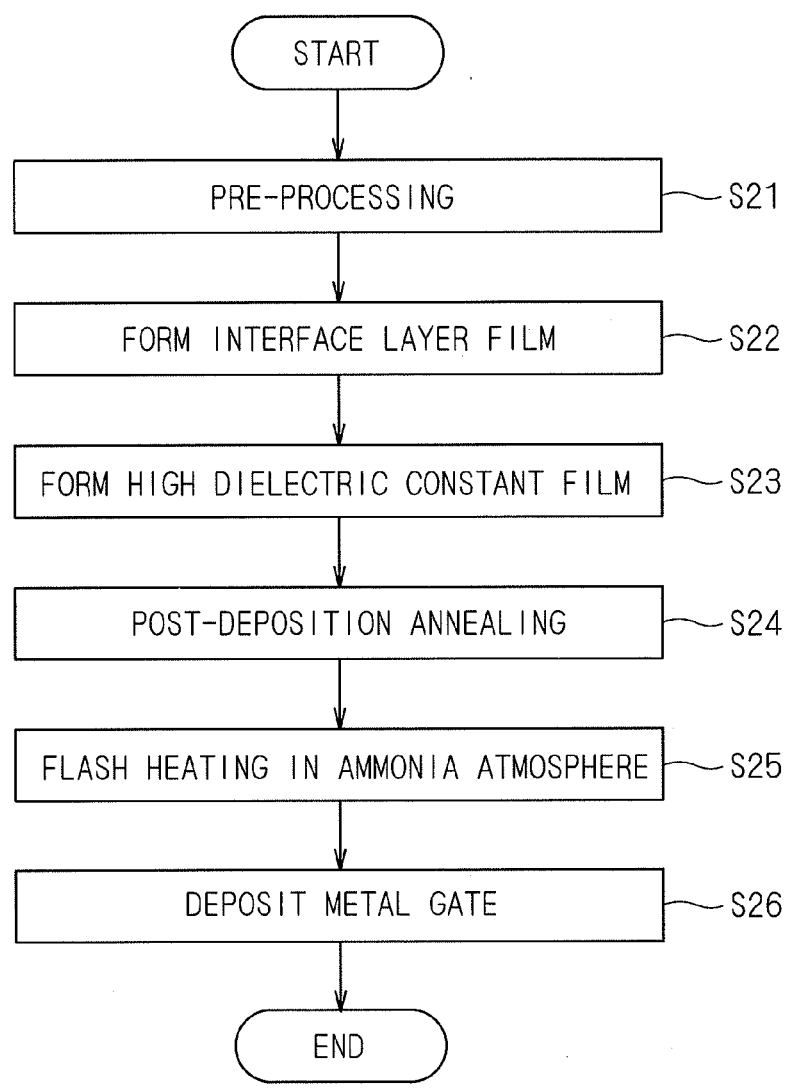
FIGS. 13 to 15 are flowcharts illustrating other examples of the procedure of processing for forming a gate on a substrate.
Figure 14:
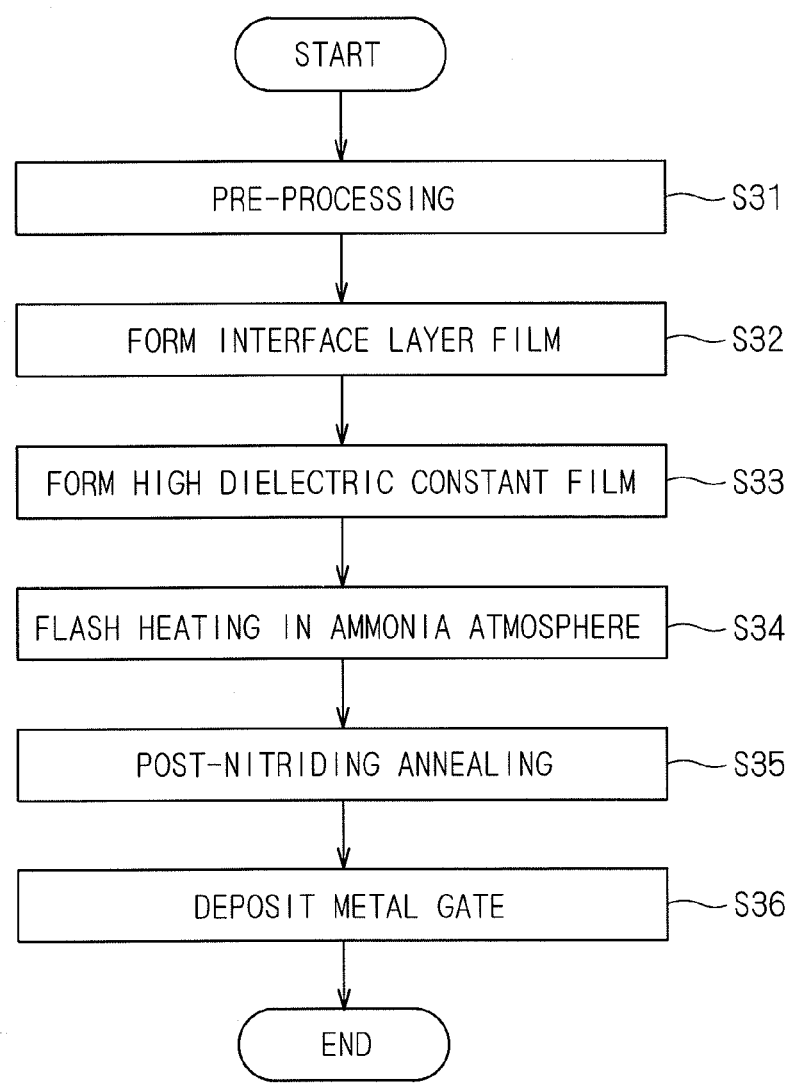

Alternatively, defects in the high-dielectric-constant gate insulator 103 may be destroyed through additional heat treatment that is different from flash heating conducted in an ammonia atmosphere. FIGS. 13 and 14 are flowcharts illustrating other examples of the procedure of processing for forming a gate on the substrate W. In the example illustrated in FIG. 13, after the formation of the high-dielectric-constant gate insulator 103, post-deposition annealing is performed prior to flash heating performed by the heat treatment apparatus 1 (step S24). This process may be performed by rapid thermal process (RTP) using halogen lamps, or may be performed by flash heating using flash lamps. When the post-deposition annealing in step S24 is performed by flash heating, this process may be performed after a nitrogen atmosphere is formed in the chamber 6 by the heat treatment apparatus 1 of the present embodiment. Execution of the post-deposition annealing reduces defects in the post-deposition high-dielectric-constant gate insulator 103 and suppresses the occurrence of leakage current due to such defects in conjunction with the effect achieved by nitriding. Note that steps S21, S22, S23, and S26 in FIG. 13 are respectively the same as steps S11, S12, S13, and S19 in FIG. 10, and step S25 in FIG. 13 is the same as the processes performed in steps S14 to S18 in FIG. 10.

In the example illustrated in FIG. 14, post-nitriding annealing is performed after flash heating performed by the heat treatment apparatus 1 (step S35). This process may also be performed by RTP using halogen lamps, or may be performed by flash heating using flash lamps. When the post-nitriding annealing in step S35 is performed by flash heating, this process may be performed after a nitrogen atmosphere is formed in the chamber 6 by the heat treatment apparatus 1 of the present embodiment. Execution of the post-nitriding annealing reduces defects in the post-deposition high-dielectric-constant gate insulator 103 and suppresses the occurrence of leakage current due to such defects in conjunction with the effect achieved by nitriding. Note that steps S31, S32, S33, and S36 in FIG. 14 are respectively the same as steps S11, S12, S13, and S19 in FIG. 10, and step S34 in FIG. 14 is the same as the processes performed in steps S14 to S18 in FIG. 10.

When the post-nitriding annealing is performed in an extremely short time by flash heating, interface diffusion of nitrogen atoms in the high-dielectric-constant gate insulator 103 can be suppressed. In addition, the interface state can be reduced when post-nitriding annealing is performed in a hydrogen atmosphere by flash heating.

Ultimately, when nitriding of the high-dielectric-constant gate insulator 103 and destruction of defects are simultaneously performed in a single flash heating process by the heat treatment apparatus 1 as in the above-described preferred embodiment, the processing steps can be more simplified than in the examples in FIGS. 13 and 14, and throughput can be improved.

Figure 15:
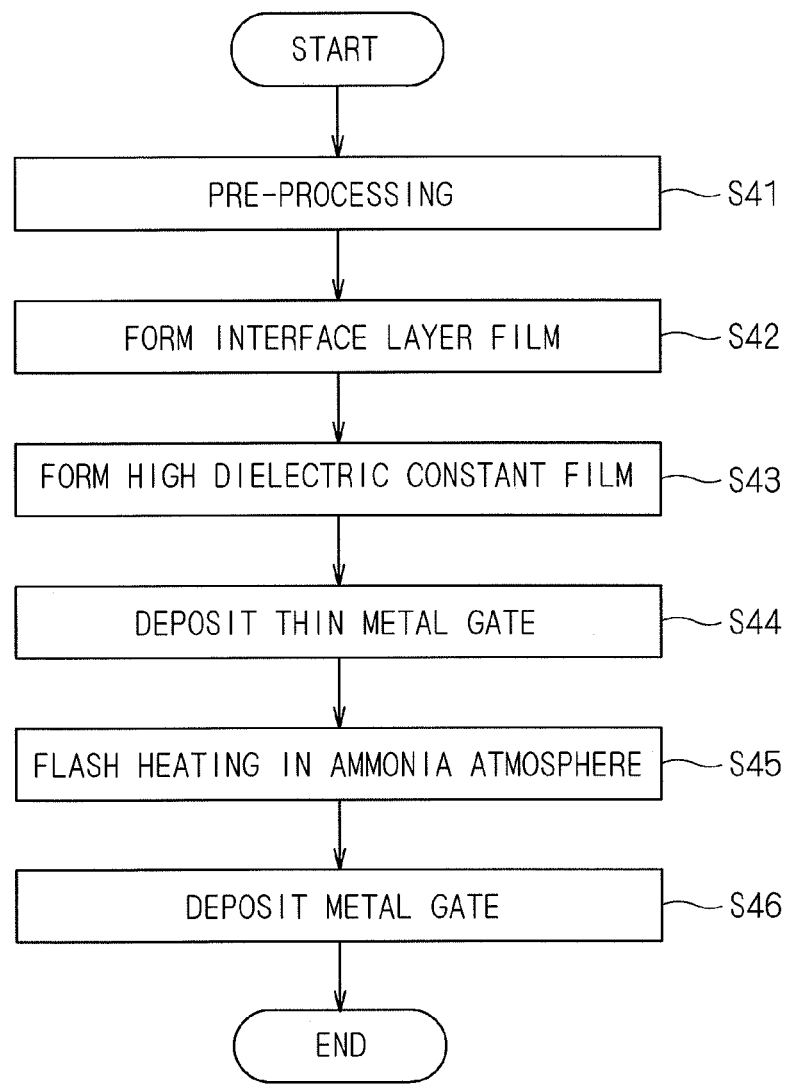

A processing procedure as illustrated in FIG. 15 is also possible. Steps S41, S42, and S43 in FIG. 15 are respectively the same as steps S11, S12, and S13 in FIG. 10. In the example in FIG. 15, after the high-dielectric-constant gate insulator 103 is formed on the interface layer film 102, a thin metal gate is further deposited on the high-dielectric-constant gate insulator 103 (step S44). Then, with the thin metal gate deposited on the high-dielectric-constant gate insulator 103, the heat treatment apparatus 1 performs flash heating in an ammonia atmosphere (step S45). This reduces defects in not only the high-dielectric-constant gate insulator 103 but also the deposited metal gate, thus improving the characteristics of the metal gate. After that, another metal gate is further deposited on the thin metal gate (step S46).

While a mixed gas of ammonia and nitrogen gas is supplied into the chamber 6 in the above-described preferred embodiment, the present invention is not limited to this example, and a dilute gas to be mixed with ammonia may be hydrogen gas ($H_2$), argon (Ar), helium (He), or xenon (Xe), for example. A mixed gas of any of these gases and ammonia may be supplied to the heat treatment space 65 to form an ammonia atmosphere in the chamber 6. In particular, helium has a good property of taking heat and is also used as a cooling gas. Thus, using a mixed gas of ammonia and helium increases the rate of cooling the substrate W that has gone through flash heating.

The material for the base material 101 is not limited to silicon and may be germanium (Ge) or silicon germanium. When a material other than silicon is used for the base material 101, the interface layer film 102 may also be made of a material other than silicon dioxide.

While the IGBT 96 is used to control light emission from the flash lamps FL in the above-described embodiment, the IGBT 96 is not always an essential element. Even if the IGBT 96 is not used, the conditions of light emission from the flash lamps FL can be adjusted by the voltage applied to the capacitor 93 or the inductance of the coil 94.

While the invention has been shown and described in detail, the foregoing description is in all aspects illustrative and not restrictive. It is therefore to be understood that numerous modifications and variations can be devised without departing from the scope of the invention.

What is claimed is:

1. A heat treatment method for heating a substrate in which a high dielectric constant film is deposited on a base material with an interface layer film sandwiched in between, the method comprising the steps of:
   (a) housing said substrate in a chamber;
   (b) supplying ammonia to said chamber to form an ammonia atmosphere; and
   (c) applying flash light to a surface of said substrate housed in said chamber to heat said high dielectric constant film, in a manner effective for nitriding said high dielectric constant film, wherein
   the flash light applied in said step (c) has a spectral distribution that has a peak in a wavelength range of 200 to 300 nm.

2. A heat treatment method for heating a substrate in which a high dielectric constant film is deposited on a base material with an interface layer film sandwiched in between, the method comprising the steps of:
   (a) housing said substrate in a chamber;
   (b) supplying ammonia to said chamber to form an ammonia atmosphere; and
   (c) applying flash light to a surface of said substrate housed in said chamber to heat said high dielectric constant film, in a manner effective for nitriding said high dielectric constant film, wherein
   the flash light applied in said step (c) has a spectral distribution showing that relative intensity at a wavelength of 300 nm is 20% or more higher than an intensity at a wavelength of 500 nm.

3. A heat treatment method for heating a substrate in which a high dielectric constant film is deposited on a base material with an interface layer film sandwiched in between, the method comprising the steps of:
   (a) housing said substrate in a chamber;
   (b) supplying ammonia to said chamber to form an ammonia atmosphere; and
   (c) applying flash light to a surface of said substrate housed in said chamber to heat said high dielectric constant film, in a manner effective for nitriding said high dielectric constant film, wherein
   post-deposition annealing is performed on said high dielectric constant film prior to said step (c).

4. A heat treatment method for heating a substrate in which a high dielectric constant film is deposited on a base material with an interface layer film sandwiched in between, the method comprising the steps of:
   (a) housing said substrate in a chamber;
   (b) supplying ammonia to said chamber to form an ammonia atmosphere; and
   (c) applying flash light to a surface of said substrate housed in said chamber to heat said high dielectric constant film, in a manner effective for nitriding said high dielectric constant film, wherein
   post-nitriding annealing is performed on said high dielectric constant film after said step (c).

* * * * *